(12) United States Patent
Ito et al.

(10) Patent No.: US 7,670,144 B2
(45) Date of Patent: Mar. 2, 2010

(54) CONDUCTIVE LAYER, MANUFACTURING METHOD OF THE SAME, AND SIGNAL TRANSMISSION SUBSTRATE

(75) Inventors: Eiichi Ito, Chiba (JP); Koji Tsuda, Saitama (JP); Tadashi Minakuchi, Saitama (JP); Mitsuhiro Matsumoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 568 days.

(21) Appl. No.: 11/563,311

(22) Filed: Nov. 27, 2006

(65) Prior Publication Data

US 2007/0120219 A1 May 31, 2007

(30) Foreign Application Priority Data

Nov. 28, 2005 (JP) ............... P2005-341760

(51) Int. Cl.
*H01R 33/00* (2006.01)
(52) U.S. Cl. ................................. 439/37; 257/530
(58) Field of Classification Search .............. 338/210, 338/211, 214; 307/125–131; 112/475.01–475.26
See application file for complete search history.

(56) References Cited

U.S. PATENT DOCUMENTS

| | | | | |
|---|---|---|---|---|
| 4,918,409 | A | * | 4/1990 | Lamberty ............... 333/1.1 |
| 5,191,174 | A | * | 3/1993 | Chang et al. ............ 174/266 |
| 7,109,933 | B2 | | 9/2006 | Ito et al. |
| 2002/0074670 | A1 | * | 6/2002 | Suga ...................... 257/777 |
| 2003/0211797 | A1 | * | 11/2003 | Hill et al. ............... 442/205 |
| 2004/0252729 | A1 | | 12/2004 | Shinoda et al. |
| 2005/0194012 | A1 | | 9/2005 | Ito et al. |

FOREIGN PATENT DOCUMENTS

| | | |
|---|---|---|
| JP | 2001-46357 | 2/2001 |
| JP | 2003-188882 | 7/2003 |
| JP | 2004-328409 | 11/2004 |
| JP | 2005-245937 | 9/2005 |

(Continued)

OTHER PUBLICATIONS

Hakozaki et al., "Digital Tactile Sensing Elements Communicating through Conductive Skin Layers", 2002.

(Continued)

*Primary Examiner*—Ha T. Nguyen
*Assistant Examiner*—Karen M Kusumakar
(74) *Attorney, Agent, or Firm*—Greenblum & Bernstein, P.L.C.

(57) ABSTRACT

There is provided a method of manufacturing a conductive layer of in a signal transmission substrate. The method includes sewing conductive thread in sheet-like material having an insulating property so as to form one of a plurality of low resistance regions using the conductive thread in a high resistance region formed by the sheet-like material, moving the conductive thread from an end point of a previously sewed low resistance region to a start point of a low resistance region to be sewed subsequently, repeating the sewing and moving steps to form the plurality of low resistance regions in the high resistance region, and forming a plurality of holes in the conductive layer by press working so that an electrical component attached to at least one of the plurality of holes is able to transmit a signal between neighboring ones of the plurality of low resistance regions.

12 Claims, 11 Drawing Sheets

FOREIGN PATENT DOCUMENTS

JP          2005-245938          9/2005

OTHER PUBLICATIONS

"Cellcross Co., Ltd. Home Corporate Profile Technical Information", retrieved from the internet at www.cellcross.co.jp/technology.html on Nov. 20, 2006, and an English translation.

English language abstract of JP 2001-46357.
English language abstract of JP 2003-188882.
English language abstract of JP 2005-245938.
English language abstract of JP 2005-245937.
English language abstract of JP 2004-328409.
Shinoda et al., "Two-Dimensional Signal Transmission Technology for Robotics", 2003.

* cited by examiner

CONDUCTIVE LAYER, MANUFACTURING METHOD OF THE SAME, AND SIGNAL TRANSMISSION SUBSTRATE

BACKGROUND OF THE INVENTION

The present invention relates to a configuration of a conductive layer to be employed in a signal transmission substrate for transmitting a signal in accordance with a two dimensional Diffusive Signal-Transmission technology.

Recently, a technology for transmitting a signal (a packet) to a destination via a plurality of DST (Diffusive Signal-Transmission) chips has been proposed as described in Japanese Patent Provisional Publication No. 2004-328409 (hereafter, referred to as JP 2004-328409A) and on a web site "http://www.utri.co.jp/venture/venture2.html" (retrieved in November, 2005) by CELLCROSS Co., Ltd (the same contents are also available on the website http://www.cellcross.co.jp/technology.html). Hereafter, such a technology is referred to as a 2D-DST (two-dimensional DST) technology.

In JP 2004-328409A, a communication device having a conductive layer configured to include a plurality of low electrical resistance layers and high electrical resistance layers is disclosed. A signal transmission substrate of the communication device is formed of a flexible thin member. By using the 2D-DST technology, it is possible to form communication circuits on fabric. Japanese Patent Provisional Publication No. 2001-46357 discloses a diagnostic vest formed of a substrate employing the 2D-DST technology.

The diagnostic vest needs to have extensibility as well as flexibility because the diagnostic vest is used as clothes. However, if a member having extensibility (e.g., fabric) is used for each layer of the diagnostic vest, a yield of diagnostic vests may decrease because of a trouble which may be caused in a manufacturing process of diagnostic vests. For example, if a low electrical resistance layer is formed of fabric having conductivity and extensibility and a high electrical resistance layer is formed of fabric having an insulating property and extensibility, it is difficult to exactly align the low electrical resistance layer with the high electrical resistance layer to laminate these layers together because these layers do not have rigidity.

Therefore, a manufacturer of diagnostic vests is required to reduce the accuracy of alignment between the low and high electric resistance layers, or to conduct a screening test for screening out defectives.

SUMMARY OF THE INVENTION

The present invention is advantageous in that a method of manufacturing a conductive layer used in a signal transmission substrate configured to enhance the accuracy of alignment between high and low electrical resistance portions is provided, and/or a conductive layer formed in accordance with the manufacturing method is provided, and and/or a signal transmission substrate having the conductive layer is provided.

According to an aspect of the invention, there is provided a method of manufacturing a conductive layer to be included in a signal transmission substrate for transmitting a signal in accordance with a two-dimensional diffusive signal-transmission technology. The conductive layer has a plurality of low resistance regions and a high resistance region to insulate neighboring ones of the plurality of low resistance regions from each other. The method includes sewing conductive thread in sheet-like material having an insulating property so as to form one of the plurality of low resistance regions using the conductive thread in the high resistance region formed by the sheet-like material, moving the conductive thread from an end point of sewing of a previously sewed low resistance region to a start point of sewing of a low resistance region to be sewed subsequently, repeating the sewing and moving to form the plurality of low resistance regions in the high resistance region, and forming a plurality of holes in the conductive layer by press working so that an electrical component attached to at least one of the plurality of holes is able to transmit a signal between neighboring ones of the plurality of low resistance regions.

By manufacturing the conductive layer in accordance with the above mentioned method, it is possible to easily align the plurality of low resistance regions with the high resistance region. Therefore, easiness of manufacturing of the conductive layer and positioning accuracy of the low resistance regions can be enhanced. By employing conductive thread as material of the low resistance region, it is possible to form a conducive layer without laminating a low resistance layer and a high resistance layer together. Therefore, a layer structure of the signal transmission structure can be simplified.

In at least one aspect, the conductive thread interconnecting the start point and the end point of neighboring low resistance regions is also cut by forming the plurality of holes by the press working.

In at least one aspect, the sheet-like material includes fabric.

In at least one aspect, the electrical component includes a communication chip.

According to another aspect of the invention, there is provided a conductive layer to be included in a signal transmission substrate for transmitting a signal in accordance with a two-dimensional diffusive signal-transmission technology. The conductive layer includes a plurality of low resistance regions, and a high resistance region serving to insulate the plurality of low resistance regions from each other. In this configuration, each of the plurality of low resistance regions is formed by conductive thread.

Such a configuration makes it possible to simplify a layer structure of the signal transmission structure.

In at least one aspect, the high resistance region is formed of sheet-like material having an insulating property, and each of the plurality of low resistance regions is formed by sewing the conductive thread in each of the plurality of low resistance regions.

In at least one aspect, the conductive thread is sewed in each of the plurality of low resistance regions at least in different two directions.

In at least one aspect, the different two directions intersect with each other at an acute angle.

In at least one aspect, the different two directions intersect with each other at a right angle.

In at least one aspect, the conductive layer further includes a plurality of holes arranged in a matrix. In this case, the plurality of holes serve to respectively catch a plurality of communication chips transmitting a signal in accordance with the two-dimensional diffusive signal-transmission technology, and each of the different two directions forms an angle with respect to a direction in which the plurality of through holes are aligned.

In at least one aspect, at least a communication chip transmitting a signal in accordance with the two-dimensional diffusive signal-transmission technology is located between neighboring ones of the plurality of low resistance regions.

In at least one aspect, each of the plurality of low resistance regions is formed to have a rectangular shape, and the at least one communication chip is located to contact four sides of rectangular shapes of four low resistance regions surrounding the at least one communication chip.

In at least one aspect, each of the plurality of low resistance regions is formed to have a cross shape, and the at least one communication chip is located at a boundary between the neighboring ones of the plurality of low resistance regions.

In at least one aspect, the conductive thread is crinkled threads.

In at least one aspect, the sheet-like material includes fabric.

In at least one aspect, the conductive thread is sewed in each of the plurality of low resistance regions so that the sewed conductive thread form a plurality of zigzag patterns.

According to another aspect of the invention, there is provided a signal transmission substrate for transmitting a signal in accordance with a two-dimensional diffusive signal-transmission technology. The signal transmission substrate includes at least one insulating layer, and a conductive layer through which the signal is transmitted. In this configuration, the conductive layer includes a plurality of low resistance regions, and a high resistance region serving to insulate the plurality of low resistance regions from each other. Each of the plurality of low resistance regions is formed by conductive thread.

Such a configuration makes it possible to simplify a layer structure of the signal transmission structure.

In at least one aspect, the conductive layer further includes a plurality of holes arranged in a matrix located such that each of the plurality of holes contacts at least two neighboring ones of the plurality of low resistance regions. In this case, the plurality of holes serve to respectively catch electrical components.

In at least one aspect, at least parts of the electrical components are communication chips transmitting a signal in accordance with the two-dimensional diffusive signal-transmission technology.

In at least one aspect the other parts of the electrical components are short-circuit members.

BRIEF DESCRIPTION OF THE ACCOMPANYING DRAWINGS

DETAILED DESCRIPTION OF THE EMBODIMENTS

Hereinafter, embodiments according to the invention are described with reference to the accompanying drawings.

First Embodiment

Figure 1A:
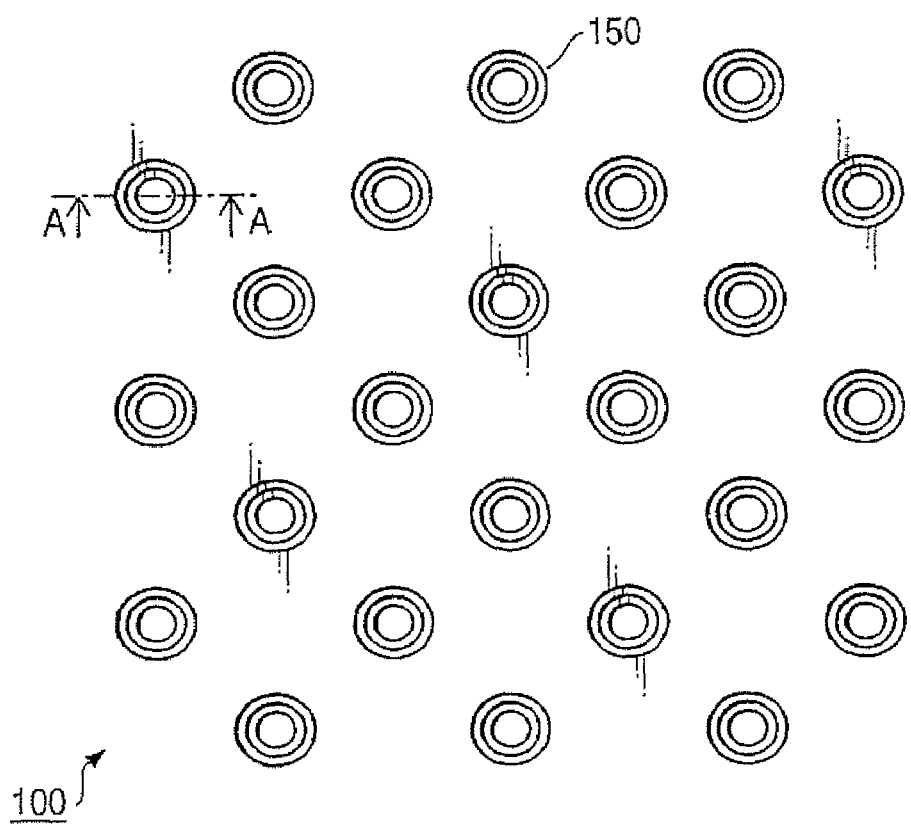
FIG. 1A is a plan view of a signal transmission substrate according to a first embodiment.
Figure 1B:
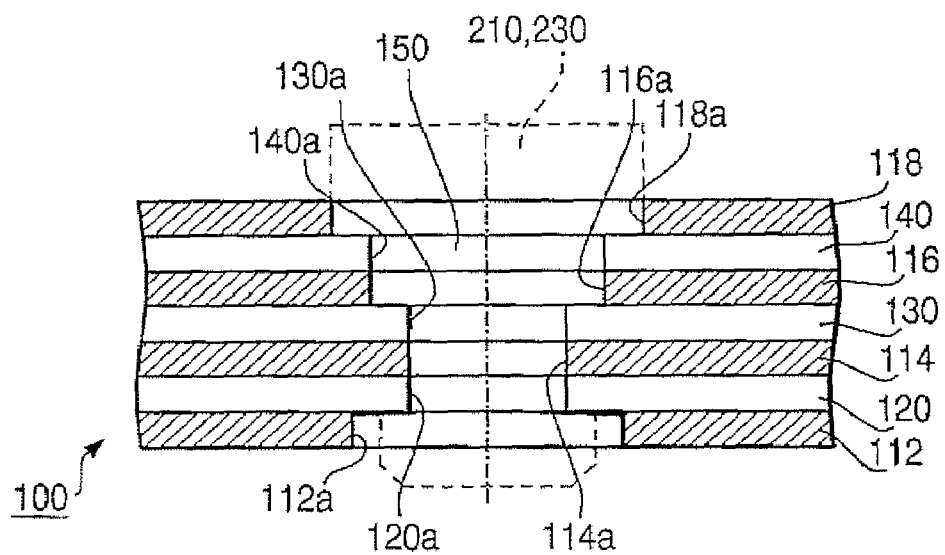
FIGS. 1B is a cross-sectional view of the signal transmission substrate along a line A-A in FIG. 1A.

FIG. 1A is a plan view of a signal transmission substrate 100 according to a first embodiment. FIG. 1B is a cross-sectional view of the signal transmission substrate 100 along a line A-A in FIG. 1A. The signal transmission substrate 100 is employed in a communication device 300 (see FIGS. 4 and 5). The signal transmission substrate 100 has a laminated structure of seven layers including an insulating layer 112, a ground layer 120, an insulating layer 114, a signal layer 130, an insulating layer 116, a power layer 140, and an insulating layer 118 from the bottom.

Each of the insulating layers 112, 114, 116 and 118 is formed of, for example, fabric having flexibility, extensibility and an insulating property. The insulating layer 112 insulates the ground layer 120 from the outside, the insulating layer 114 insulates the signal layer 130 from the ground layer 120, the insulating layer 116 insulates the signal layer 130 from the power layer 140, and the insulating layer 118 insulates the power layer 140 from the outside. The insulating layers 112, 114, 116 and 118 respectively have through holes 112a, 114a, 116a and 118a into which a DST chip-equipped connector 210 or a connector 230 (which are shown in FIG. 1B by a dashed line) can be inserted (see FIGS. 4 and 5). As shown in FIG. 1A, each insulating layer is provided with a plurality of through holes.

Each of the ground layer 120 and the power layer 140 is formed of, for example, fabric having flexibility, extensibility and conductivity. The ground layer 120 is kept at a ground level for signal transmission in accordance with the 2D-DST technology. Through the signal layer 130, a signal is transmitted in accordance with the 2D-DST technology. The power layer 140 serves to supply power to 2D-DST chips. The ground layer 120, the signal layer 130 and the power payer 140 respectively have through holes 120a, 130a and 140a through which the DST chip-equipped connector 210 or the connector 230 can be inserted.

The seven layers are laminated to each other so that the through holes are concentrically aligned about a center axis of a through hole part 150. As shown in FIG. 1B, the diameters of the through holes gradually increase from the lower side.

Specifically, the through hole 118a has the largest diameter, the through holes 140a and 116a have the same second largest diameter, and the through holes 130a, 114a and 120a have the same smallest diameter. The through holes of the seven layers form the through hole part 150.

As shown in FIG. 1B, an inside wall of the through hole part 150 has a step-like structure. The through hole 112a formed at the bottom of the signal transmission substrate 100 has the diameter larger than that of the through hole 120a so as to catch a nail part (which is described later) of the 2D-DST chip-equipped connector 210 or the connector 230. As shown in FIG. 1B, a part of each of the signal layer 130 and the power layer 140 is exposed upwardly to the outside in the through hole part 150, and a part of the ground layer 120 is exposed downwardly to the outside in the through hole part 150. Such a configuration enables the DST chip-equipped connector 210 or the connector 230 to be electrically connected to conductive layers of the signal transmission substrate 100 in a state where the DST chip-equipped connector 210 or the connector 230 is connected to the through hole part 150.

Figure 2A:
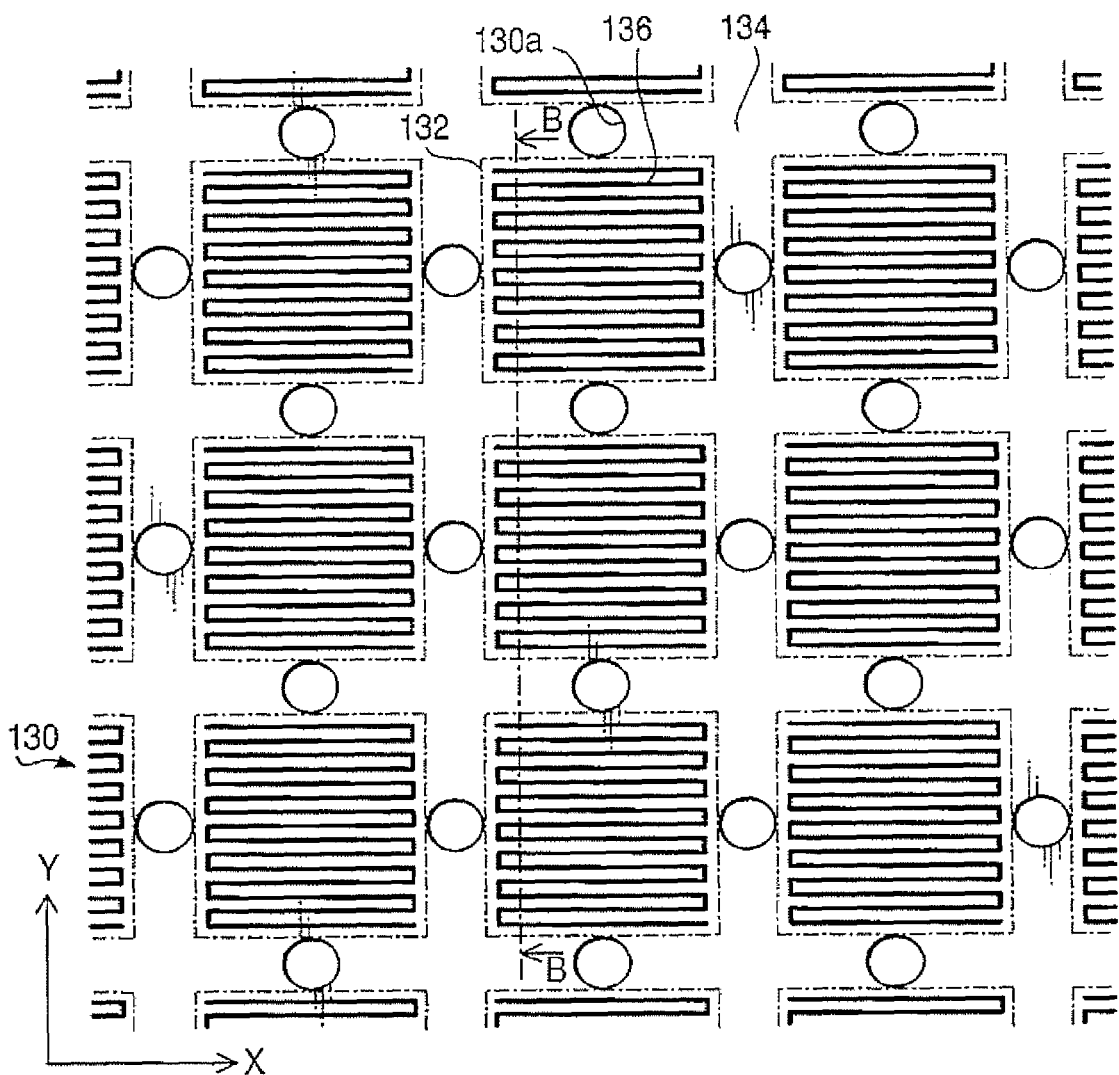
FIG. 2A is a partial plan view of a signal layer in the signal transmission substrate.
Figure 2B:
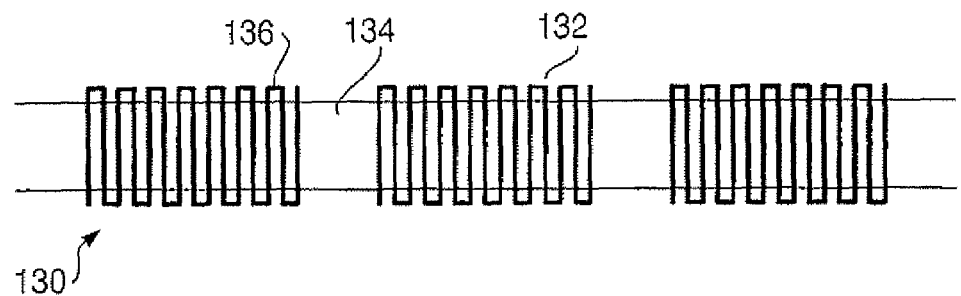
FIG. 2B shows a cross-section of the signal layer along a line B-B in FIG. 2A.

FIG. 2A is a partial plan view of the signal layer 130. FIG. 2B shows a cross-section of the signal layer 130 along a line B-B in FIG. 2A. The signal layer 130 includes fabric having flexibility, extensibility and an insulating property as a foundation layer, and is configured such that conductive thread 136 made of conductive fiber is sewed in predetermined regions. By this structure, a plurality of low resistance regions 132 having low electric resistance and a high resistance region 134 having electric resistance higher than that of the low resistance region 132 are formed in the signal layer 130.

In each low resistance region 132, the conductive thread 136 made of conductive fiber is sewed. Each low resistance region 132 is formed to have a rectangular shape when viewed as a plan view (see FIG. 2A). The high resistance region 134 is a region in which the conductive thread 136 is not sewed.

As shown in FIG. 2A, the low resistance regions 132 are aligned in a matrix, and each low resistance region 132 is placed to have a predetermined interval with respect to each of the surrounding low resistance regions 132 in longitudinal and lateral directions. The predetermined interval is substantially equal to the diameter of the through hole 130a.

In each of FIGS. 2A and 2B, each low resistance region 132 is illustrated such that lines of the conductive thread 136 are aligned at predetermined intervals in regard to a Y-direction. However, in a practical sense, these lines of the conductive thread 136 are sewed in the fabric of the signal layer 130 such that neighboring lines of the conducive thread 136 closely contact with each other.

By configuring the signal layer 130 with the fabric and the thread, it is possible to easily align each low resistance region 132 with respect to the fabric forming the high resistance region 134 and not having rigidity. Therefore, manufacturing easiness of the signal layer 130 can be enhanced, and the positioning accuracy of each low resistance region 132 can also be enhanced. By employing thread as material for providing conductivity for each low resistance region 132, it is possible to reduce the thickness of the signal layer 130 because in this case it is not necessary to laminate a low resistance layer and a high resistance layer together. By configuring the signal layer 130 as mentioned above, flexibility and extensibility of the signal layer 130 can be prevented from being deteriorated.

In this embodiment, the thread in each low resistance region 132 is sewed in the fabric such that a plurality of lines of the thread extending in a X-direction are aligned to closely contact with each other. In general, fabric has more excellent extensibility than thread. Therefore, the signal layer 130 exhibits a property that the extensibility thereof in the Y-direction is higher than that in the X-direction because the conductive thread 136 is distributed in the signal layer 130 discontinuously in the Y-direction (in which lines of the conductive thread 136 are aligned) and is distributed in the signal layer 130 continuously in the X-direction (in which each line of the conductive thread 136 is extended).

The conductive thread 136 may be straightened thread or crinkled thread. If crinkled thread is used as the conductive thread 136, the extensibility of the signal layer 130 is further enhanced because in this case the crinkled thread is able to be extended by a length larger than that of the straightened thread. Therefore, by employing the crinkled thread, it is possible to secure relatively high extensibility of the signal layer 130 in the X-direction.

Figure 3:
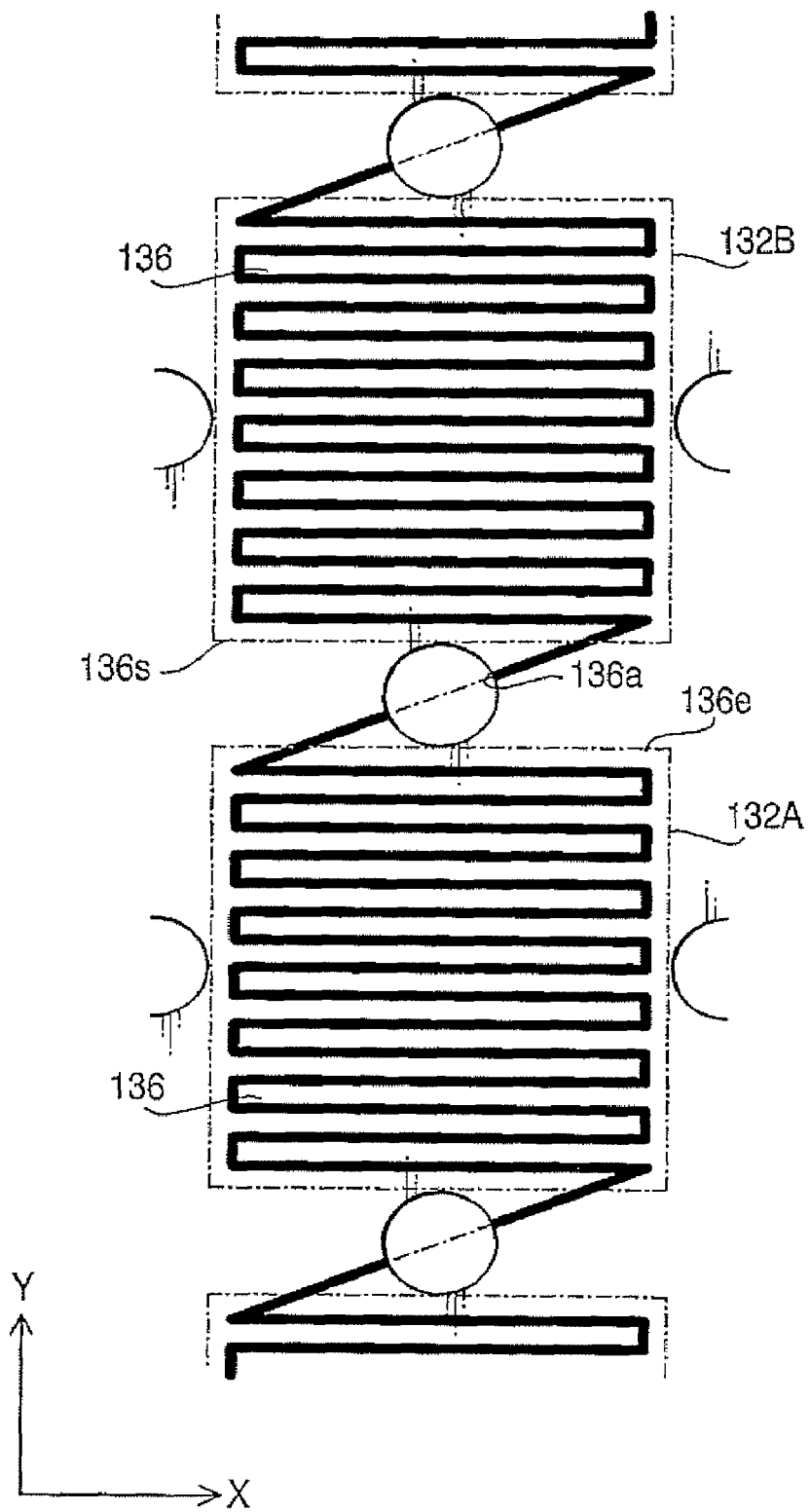
FIG. 3 is an explanatory illustration for explaining a manufacturing method of the signal layer in the signal transmission substrate.

FIG. 3 is an explanatory illustration for explaining a manufacturing method of the signal layer 130 in the signal transmission substrate 100. It should be noted that in FIG. 3 only a part of the signal layer 130 is illustrated for the sake of simplicity.

To form the low resistance region 132 in the fabric forming the high resistance region 134, first, an operator operates, for example, a sewing machine so that a line of the conductive thread 136 is sewed in the fabric of the signal layer 130 in the X direction by an amount corresponding to a side of the rectangular shape of the low resistance region 132. Then, the sewing machine is operated so that a sewing position is shifted in the Y-direction by an amount corresponding to a diameter of the conductive thread 136 so that a next line of the conductive thread 136 is sewed in the fabric to closely contact a previous line of the conductive thread 136 extending in the X-direction. That is, along the X-axis, the next line is sewed oppositely to the direction in which the previous line is sewed.

When the length of the sewed part in the Y-direction reaches a size corresponding to a side of the low resistance region 132 while the above mentioned sewing operation is repeated, formation of one low resistance region 132 is finished. After formation of one low resistance region 132 is finished, the operator operates the sewing machine to move the conductive thread 136 to a start point of sewing of a next low resistance region 132.

More specifically, as shown in FIG. 3, the operator operates the sewing machine to finish a low resistance region 132A by sewing the conductive thread 136 in the fabric. When the conductive thread 136 being sewed in the fabric reaches an end point 136e, the formation of the low resistance region 132A finishes. Then, the conductive thread 136 is moved to a start point 136s without being cut and then a low resistance region 132B is formed similarly to the sewing of the low resistance region 132A. By repeating such a sewing operation, the plurality of low resistance regions 132 can be formed in the fabric forming the high resistance region 134.

To isolate the low resistance regions 132 with respect to each other, it is required to cut each line of the thread 136 connecting the start point 136s and the end point 136e. In this embodiment, the through holes 130a are formed in the signal layer 130 by press working. When the through wholes 130a are formed by press working using a press die of a press machine, each line of thread connecting the start point 136s and the end point 132e is also cut. By thus combining the press working with the above mentioned cutting process, the manufacturing process can be reduced.

During the press working, the signal layer 130 is aligned with respect to the press machine such that each of punching shapes of the press die contacts sides of the neighboring low resistance regions 132 facing with each other.

Figure 4:
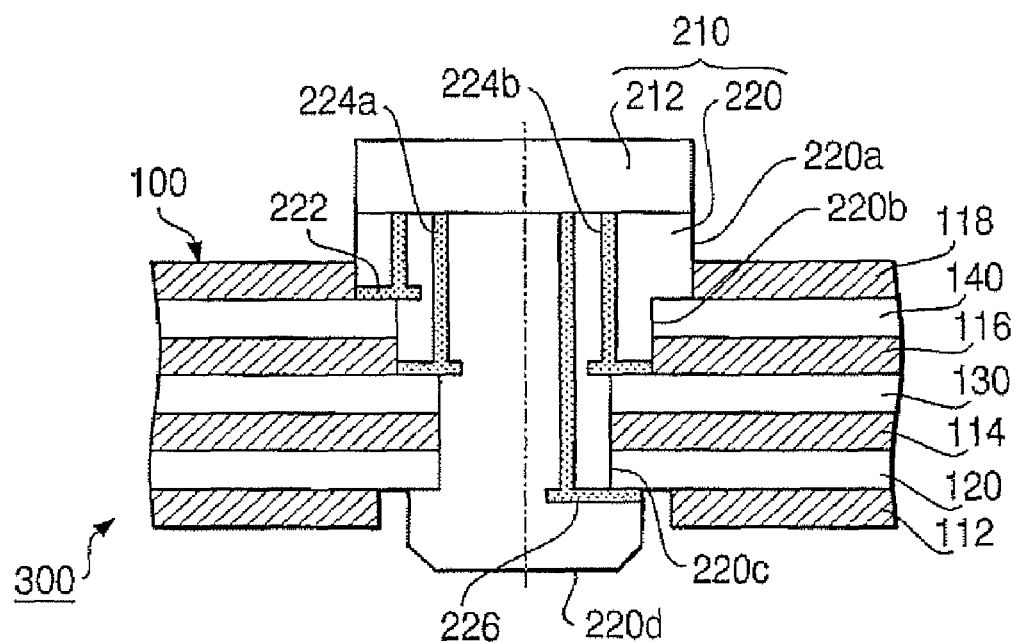
FIG. 4 is a partial cross section of a communication device according to the first embodiment illustrating a situation where a DST chip-equipped connector is attached to one of through hole parts of the signal transmission substrate.

FIG. 4 is a partial cross section of the communication device 100 according to the first embodiment illustrating a situation where the DST chip-equipped connector 210 is attached to one of the through hole parts 150. As shown in FIG. 4, the DST chip-equipped connector 210 has a DST chip 212 and a connection part 220. The DST chip 212 is attached to the top surface of the connection part 220. The DST chip 212 has a function of transmitting a signal in accordance with the 2D-DST technology. The connection part 220 is fitted into the through hole part 150 to electrically connect the DST chip 212 to the layers 120, 130 and 140 of the signal transmission substrate 100.

The connection part 220 has three cylindrical parts 220a, 220b and 220c which have different diameters and concentrically formed about a center axis of the connection part 220 so that an outer circumferential surface of the three cylindrical parts 220a, 220b and 220c form a step-like shape. At the end of the cylindrical part 220c having a smaller diameter than those of the cylindrical parts 220a and 220b, a nail part 220d is formed in all directions.

The cylindrical part 220a has the largest diameter of all of the three cylindrical parts, and the diameter of the cylindrical part 220a is substantially equal to the diameter of the through hole 118a of the insulating layer 118. At a lower surface of the cylindrical part 220a, a metal contact 222 is exposed to the outside. In the situation where the DST chip-equipped connector 210 is attached to the through hole part 150, the metal contact 222 contacts a part of the power layer 140 exposed to the outside in the through hole part 150. A distal end of the metal contact 222 is connected to the DST chip 212 attached to the top surface of the connection part 220. With this structure, the DST chip 212 is supplied with power from the power layer 140.

The cylindrical part 220b has the diameter smaller than that of the cylindrical part 220a and larger than that of the cylindrical part 220c, and the diameter of the cylindrical part 220b is substantially equal to the diameters of the through holes 140a and 116a of the power layer 140 and the insulating layer 116. At a lower surface of the cylindrical part 220b, metal contacts 224a and 224b are exposed to the outside. In the situation where the DST chip-equipped connector 210 is attached to the through hole part 150, the metal contacts 224a and 224b respectively contact parts of neighboring low resistance regions 132 in the signal layer 130. Each of distal ends of the metal contacts 224a and 224b is connected to the DST chip 212. With this structure, when the DST chip-equipped connector 210 is attached to the through hole part 150, the low resistance regions 132 adjoining to the DST chip-equipped connector 210 (i.e., a low resistance region 132 contacting the metal contact 224a and a neighboring low resistance region 132 contacting the metal contact 224b) are electrically connected to each other.

The cylindrical part 220c has the diameter substantially equal to the diameters of the through holes 130a, 114a and 120a of the signal layer 130, the insulating layer 114 and the ground layer 120. The cylindrical part 220c is provided with no metal contact, and serves mainly as a guide for positioning. As described above, the nail part 220d is formed at the lower end of the cylindrical part 220c.

The nail part 220d serves to engage the DST chip-equipped connector 210 in the though hole part 150, and has the diameter larger than the diameter of the through hole 120a and smaller than the diameter of the through hole 112a. When the DST chip-equipped connector 210 is inserted into the through hole part 150, the inside walls of the signal layer 130, the insulating layer 114 and the ground layer 120 are deformed by the pressing force from the nail part 220d. Then, after the nail part 220s passed through the through hole 12Oa, the inside walls of the signal layer 130, the insulating layer 114 and the ground layer 120 are restored to normal shapes.

In the situation where the DST chip-equipped connector 210 is fully inserted into the through hole part 150, the upper surface of the nail part 220d contacts the lower surface of the ground layer 120. In this situation, the DST chip-equipped connector 210 is engaged in the through hole part 150. As shown in FIG. 4, at the upper surface of the nail part 220d, a metal contact 220c is exposed to the outside. A distal end of the metal contact 220c is connected to the DST chip 212. With this structure, the DST chip 212 is electrically connected to the signal layer 130, the ground layer 120 and the power layer 140, so that the DST chip 212 is able to transmit a signal between the neighboring low resistance regions 132 in accordance with the 2D-DST technology.

Figure 5:
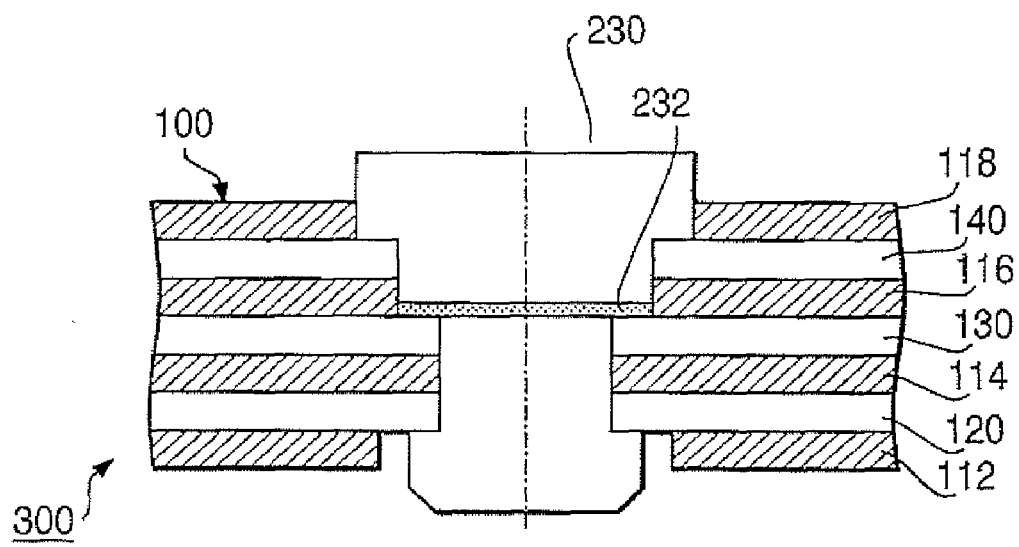
FIG. 5 is a partial cross section of the communication device illustrating a situation where a connector not equipped with a DST chip is attached to one of the through hole parts of the signal transmission substrate.

FIG. 5 is a partial cross section of the communication device 100 according to the first embodiment illustrating a situation where the connector 230 not equipped with the DST chip is attached to one of the through hole parts 150 of the signal transmission substrate 100.

The connector 230 has an outer shape equal to the outer shape of the connection part 220 of the DST chip-equipped connector 210. That is, inserted portions of the DST chip-equipped connector 210 and the connector 230 have the same shape. Therefore, it is possible to attach arbitrarily selected one of the connectors 210 and 230 to one of the through hole part 150.

The connector 230 has only a metal contact 232 which is formed on the entire region of the lower surface of a cylindrical part corresponding to the cylindrical part 220b of the connection part 220. The metal contact 232 is exposed to the outside at the lower surface of the cylindrical part corresponding to the cylindrical part 220b. In the situation where the connector 230 is fitted into the through hole part 150, the metal contact 232 contacts parts of neighboring low resistance regions 132 exposed to the outside in the through hole part 150. With this structure, in the situation where the connector 230 is fitted into the through hole part 150, the neighboring low resistance regions 132 are electrically connected to each other via the metal contact 232 of the connector 230. Since the connector 230 does not have the DST chip 212, cost of the connector 230 is lower than that of the DST chip-equipped connector 210.

Figure 6A:
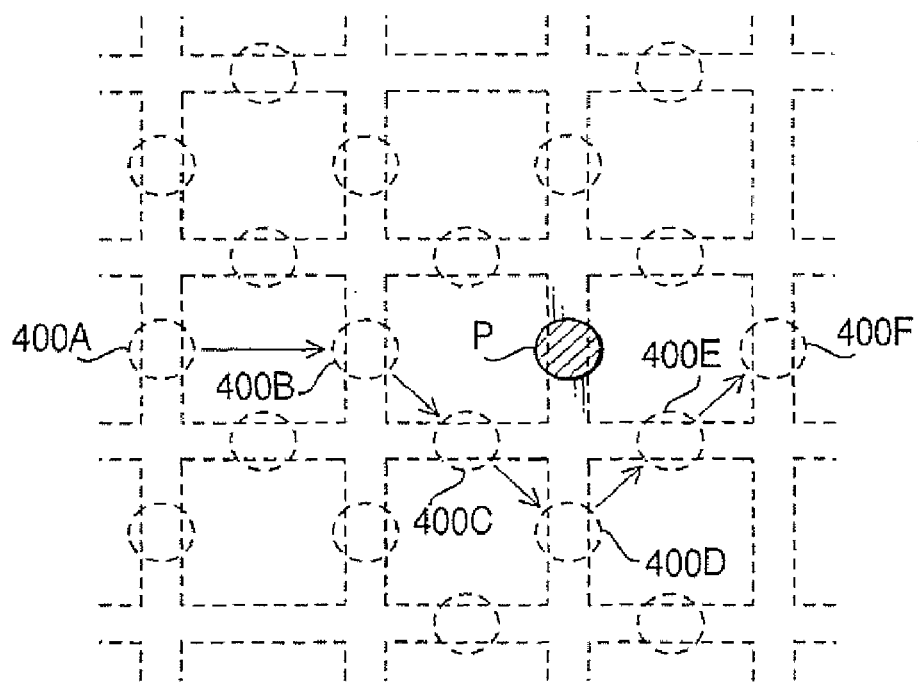
FIGS. 6A and 6B are explanatory illustrations for explaining advantages of the communication device according to the first embodiment.
Figure 6B:
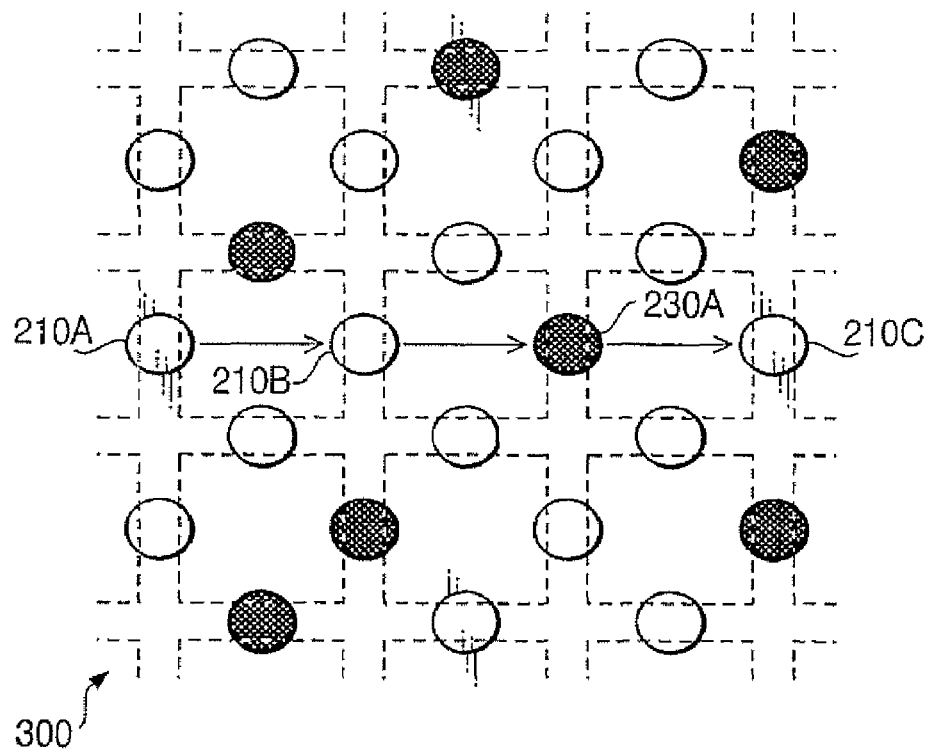

FIGS. 6A and 6B are explanatory illustrations for explaining the advantages of the communication device 300 according to the first embodiment. More specifically, FIG. 6B is a top view of the communication device 300 according to the first embodiment illustrating an example of distribution of the DST chip-equipped connectors 210 and the connectors 230. In FIG. 6B, the DST chip-equipped connectors 210 are indicated by white circles, and the connectors 230 are indicated by black circles.

FIG. 6A is a top view of a comparative example of a communication device. In the comparative example, a plurality of low resistance regions each of which has a rectangular shape are arranged in a matrix, and DST chips are distributed to contact neighboring low resistance regions. In FIG. 6A, the low resistance regions are indicated by dashed rectangles and DST chips attached to the communication device are indicated by dashed circles. In the comparative example, in order to decrease the number of DST chips and thereby to achieve the cost reduction, the DST chips are not provided at some positions (e.g., a position P show in FIG. 6A).

As shown in FIG. 6A, if a source of signal transmission is a DST chip 400A and a destination of the signal transmission is a DST chip 400F, the communication device of the comparative example selects, for example, DST chips 400A, 400B, 400C, 400D, 400E and 400F as a shortest communication path. In this case, the signal transmission is relayed by four intervening DST chips.

On the other hand, in the communication device 300 according to the first embodiment, the connectors 230 not having the DST chips 212 are placed at some positions so as to reduce the number of DST chips and thereby to achieve the cost reduction as indicated by the black circles in FIG. 6B. If a source of signal transmission is a DST chip-equipped connector 210A of which position corresponds to the DST chip 400A and a destination of the signal transmission is a DST chip-equipped connector 210C of which position corresponds to the DST chip 400F, the communication device 300 according to the first embodiment selects, for example, DST chip-equipped connectors 210A, 210B, the connector 230A, and the DST chip-equipped connector 210C as a shortest communication path. In this case, the signal transmission is relayed by two relaying points including the DST chip-equipped connector 210B and the connector 230A.

It should be noted that although each of the examples shown in FIGS. 6A and 6B is able to achieve the cost reduction by a decrease in the number of DST chips, the communication device 300 according to the embodiment is able to reduce the number of relaying points relative to the comparative example shown in FIG. 6A.

Furthermore, according to the embodiment, each connector 230 electrically connects the low resistance region 132 to its neighboring low resistance region 132. Therefore, the number of possible communication paths to be selected by the communication device 300 is larger than that of the comparative example. That is, the communication device 300 is able to reduce the number of DST chips without decreasing the number of possible communication paths and losing a possible shortest communication path. Therefore, the cost reduction can be achieved without reducing the efficiency of signal transmission.

According to the embodiment, the number and positions of the DST chips and short-circuit members (i.e., the connectors 230) can be determined arbitrarily. Such flexibility enables the communication device 300 to support various types of communication devices having different arrangement conditions (e.g., different numbers of DST chips or different distances between DST chips).

One of ways for reducing the number of DST chips in a communication device is not to cut a line of the thread 136 interconnecting a start point 132s and an end point 132e with regard to some of pairs of neighboring low resistance regions 132. However, considering mass-production of the signal layer 130, it is expensive to change positions to be punched in the press working to cut lines of the thread and to form through holes because in this case various types of press dies are needed. Further, in this case, throughput of signal transmission may be decreased because the connection between the neighboring low resistance regions is implemented by thin thread. As a result, efficiency of signal transmission decreases. It should be understood that, to avoid such disadvantages, the communication device 300 according to the embodiment is configured to interconnect neighboring low resistance regions 132 by the DST chip-equipped connector 210 or the connector 230.

Hereafter, modifications (second to sixth embodiments) of a sewing pattern of conductive thread 136 in the low resistance region 132 are described. Configurations of communication devices of the modifications described below are substantially the same as that of the communication device 300 according to the first embodiment, excepting the sewing patterns in each low resistance region. Therefore, in the following explanations, to elements which are substantially the same as those of the first embodiment, the same reference numbers are assigned, and explanations thereof will not be repeated.

Second Embodiment

Figure 7:
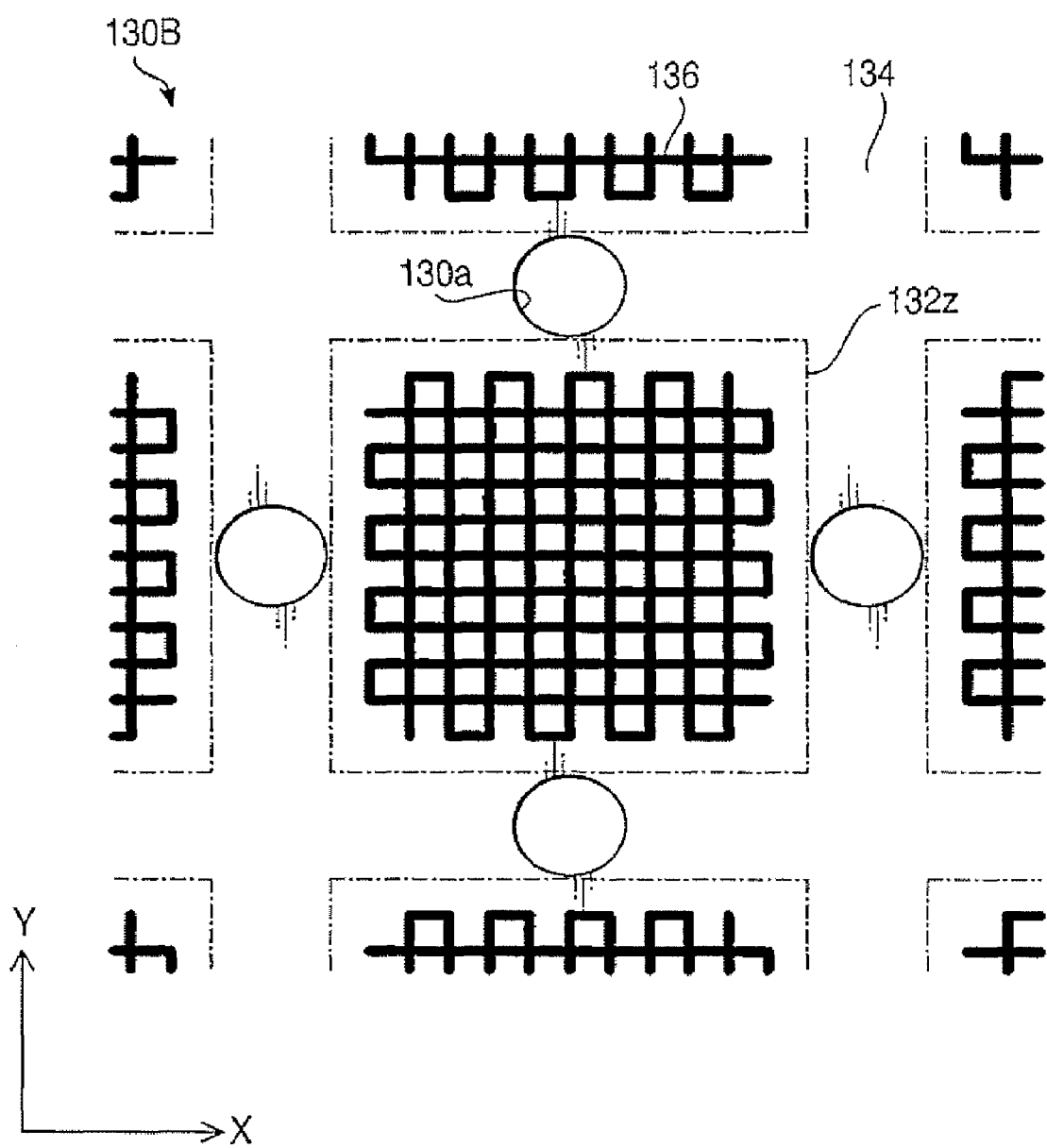
FIG. 7 is a partial top view of a signal layer of a signal transmission substrate according to a second embodiment.

FIG. 7 is a partial top view of the signal layer 130B of a signal transmission substrate according to a second embodiment. In the second embodiment, the conductive thread 136 is sewed in the fabric forming the high resistance region 134 so that lines of the conductive thread 136 are elongated both in the X and Y directions in a low resistance region 132z. In this embodiment, each low resistance region 132z is formed in two sewing processes. The two sewing processes include a first process of sewing the conductive thread 136 in the fabric to form lines of the conductive thread 136 extending in the X direction, and a second process of sewing the conductive thread 136 in the fabric to form lines of the conductive thread 136 extending in the Y direction perpendicularly intersecting with the X direction. The first process may be performed ahead of the second process, or the second process may be performed ahead of the first process.

In this embodiment, the lines of the conductive thread 136 are formed in the X and Y directions in each low resistance region 132z. However, extending directions of the lines of the conductive thread 136 are not limited to the X and Y directions. The lines of the conductive thread 136 may intersect with each other at an angle not equal to a right angle.

If the signal layer 130 according to the first embodiment is expanded in the Y direction, the lines of the conductive thread 136 adjoining to each other in the Y direction may depart from each other and thereby decrease the number of contacting points between neighboring lines of the conductive thread 136. In this case, impedance in the Y direction may increase. By contrast according to the second embodiment even if the signal layer is expanded in the X or Y direction, the neighboring lines of the conductive thread 136 may not depart from each other and the number of contacting points may not be decreased. Therefore, an increase in impedance may not occur even if the signal layer is expanded in X or Y direction.

Third Embodiment

Figure 8:
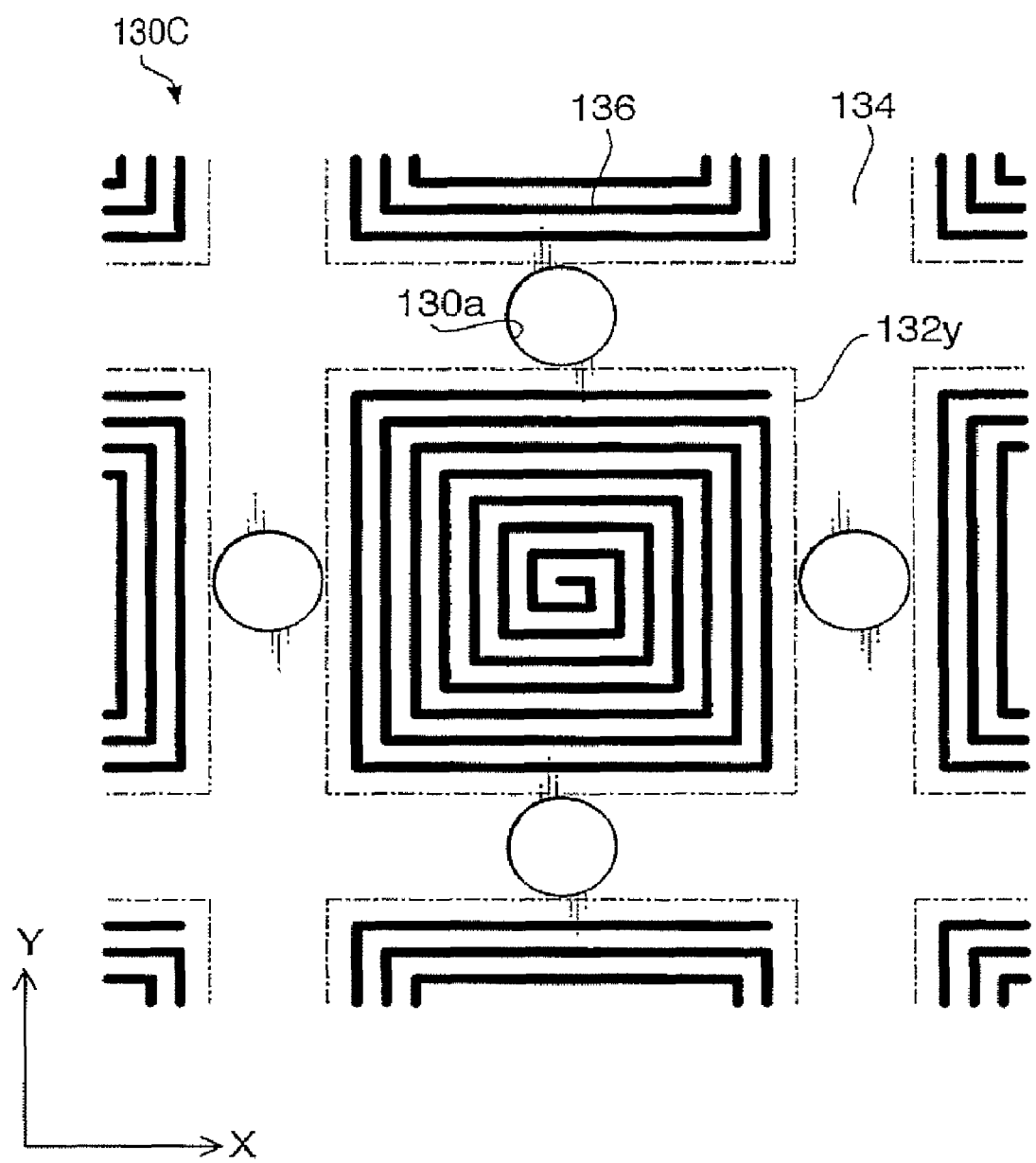
FIG. 8 is a partial top view of a signal layer of a signal transmission substrate according to a third embodiment.

FIG. 8 is a partial top view of a signal layer 130C of a signal transmission substrate according to a third embodiment. In the third embodiment, the conductive thread 136 is sewed in the fabric forming the high resistance region 134 so that a spiral pattern of the conductive thread 136 is formed in each low resistance region 132y. The low resistance region 132y may be formed by a single sewing process of sewing the conductive thread 136 in the low resistance region 132y to form a spiral pattern. Since lines of the conductive thread 136 extending both in the X and Y directions can be formed in a single sewing process, the manufacturing process can be reduced in comparison with the case of the sewing process of the second embodiment.

Fourth Embodiment

Figure 9A:
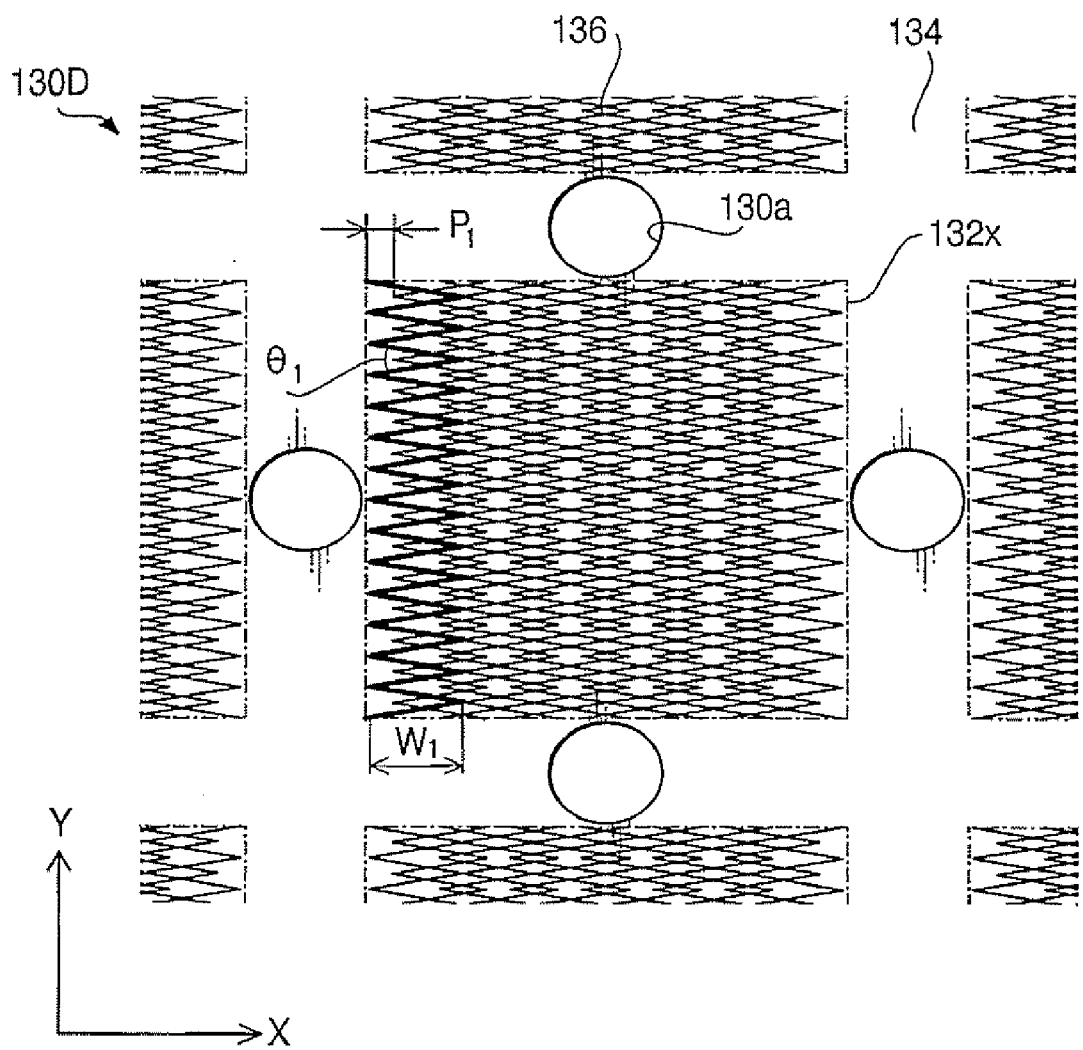
FIG. 9A is a partial top view of a signal layer of a signal transmission substrate according to a fourth embodiment.
Figure 9B:
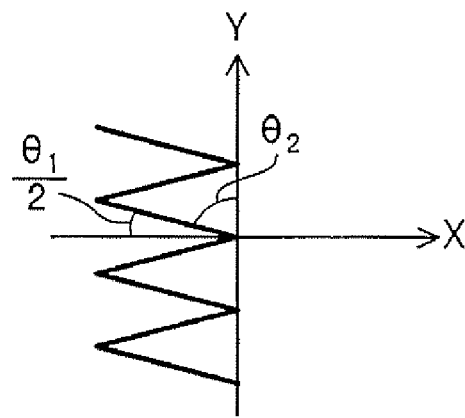
FIG. 9B is an explanatory illustration for explaining extensibility of the signal layer according to the fourth embodiment.

FIG. 9A is a partial top view of a signal layer 130D of a signal transmission substrate according to a fourth embodiment. FIG. 9B is an explanatory illustration for explaining extensibility of the signal layer 130D according to the fourth embodiment. For the purpose of explaining the extensibility of the signal layer 130D, a part of the conductive thread 136 is indicated by a heavy line and the other part of the conductive thread 136 is indicated by a thin line although the entire part of the conductive thread 136 has the same diameter.

In the fourth embodiment, the conductive thread 136 is sewed in the fabric forming the high resistance region 134 so that a plurality of zigzag patters of the conductive thread are formed in each low resistance region 132x. Each zigzag pattern has the length substantially equal to a side of the rectangular shape of the low resistance region 132x in the Y direction, a width $W_1$ in the X direction, and an apex angle $\theta_1$ (e.g., 20°). Neighboring zigzag patterns are shifted with respect to each other to have a pitch $P_1$ ($\cong W_1/4$).

By keeping the distance between the neighboring zigzag patterns at a length smaller than or equal to the width $W_1$, the neighboring zigzag patterns overlap with each other and thereby contact with each other at a plurality of contacting points. Since the neighboring zigzag patterns have the plurality of contacting points, the neighboring zigzag patterns are able to keep contacting with each other even if the signal layer 130D is expanded in any direction.

If the signal layer is expanded n the X direction, each apex angle $\theta_1$ decreases. In the situation where the signal layer is expanded until the apex angle $\theta_1$ reaches 0°, the signal layer 130D is in a state where the signal layer 130D is not able to expand anymore.

As shown in FIG. 9B, each apex angle part of the zigzag pattern has a relatively small acute angle ($=\theta_1/2$) with respect to the X direction, which means that the maximum change amount of the apex angle by expansion of the signal layer is relatively small.

If the signal layer is expanded in the Y direction, an angle $\theta_2$ ($=90°-\theta_1/2$) formed at the apex angle part with respect to the Y direction decreases. In the situation where the signal layer is expanded in the Y direction until the angle $\theta_2$ reaches 0°, the signal layer 130 is in a state where the signal layer 130 is not able to expand anymore. As shown in FIG. 9B, the angle $\theta_2$ is a relatively large acute angle. Therefore, the changing amount of the angle $\theta_2$ is relatively large. Therefore, in this embodiment, the signal layer 130D is able to expand in a relatively large amount in the Y direction.

As described above, the signal layer according to the fourth embodiment has relatively low extensibility in the X direction and relatively high extensibility in the Y direction. Furthermore, the neighboring zigzag patterns are able to keep having the plurality of contacting points even if the signal layer is expanded. Therefore, an increase in impedance is not caused by expansion of the signal layer. Consequently, the impedance of the low resistance region 132x can be kept at a low level even if the signal layer is expanded.

Fifth Embodiment

Figure 10A:
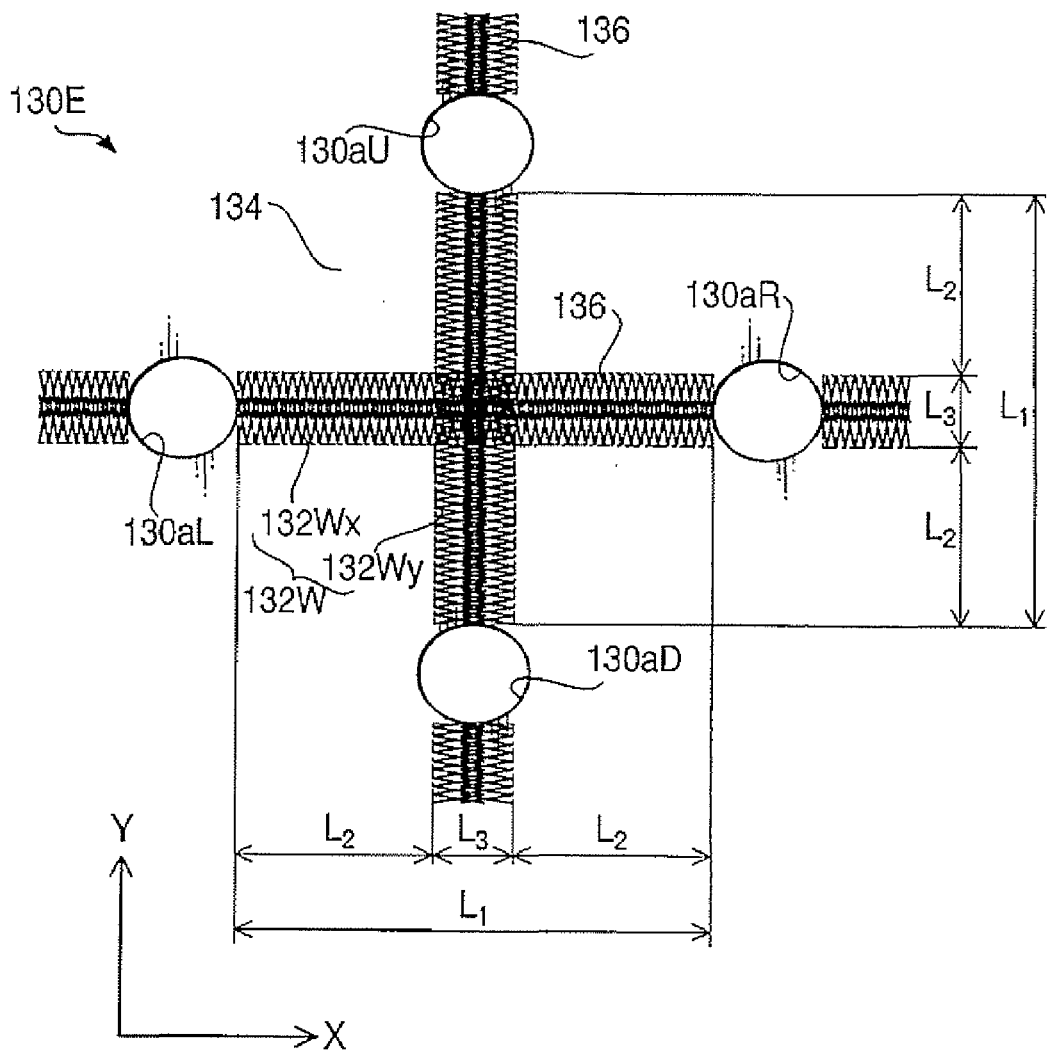
FIG. 10A is a partial top view of a signal layer of a signal transmission substrate according to a fifth embodiment.
Figure 10B:
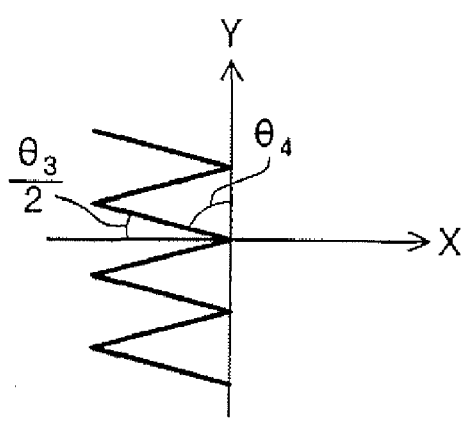
FIGS. 10B and 10C are explanatory illustrations for explaining extensibility of the signal layer according to the fifth embodiment.
Figure 10C:
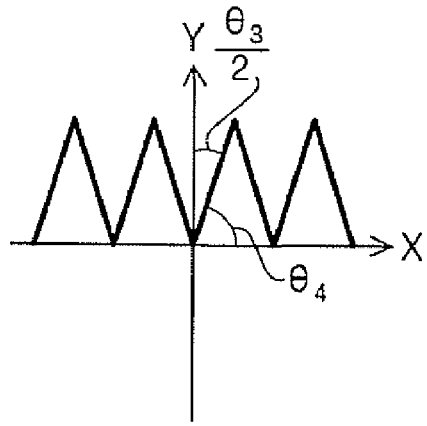

FIG. 10A is a partial top view of a signal layer 130E of a signal transmission substrate according to a fifth embodiment. FIGS. 10B and 10C are explanatory illustrations for explaining extensibility of the signal layer 130F according to the fifth embodiment.

In this embodiment, the conductive thread 136 is sewed in the fabric forming the high resistance region 134 so as to form a plurality of zigzag patterns in a low resistance region 132w. In FIG. 10A, the through hole 130a located on the upper side of the low resistance region 132w is assigned a reference number 130a, the through hole 130a located on the lower side of the low resistance region 132w is assigned a reference number 130aD, the through hole 130a located on the right side of the low resistance region 132w is assigned a reference number 130aR, and the through hole 130a located on the left side of the low resistance region 132w is assigned a reference number 130aL.

The low resistance region 132w includes two regions 132wy and 132wx. The region 132wx has the length $L_1$ and a width $L_3$ substantially equal to the diameter of the through hole 130a, and interconnects the through holes 130aL and 130aR. The region 132wy has the length $L_1$ and the width $L_3$ substantially equal to the diameter of the through hole 130a, and interconnects the through holes 130aD and 130aU. That is, the low resistance region 132w has a cross-shape having for end parts respectively contacting the through holes 130aU, 130aD, 130aR and 130aL. The regions 132wx and 132wy overlap with each other at a center of the cross shape. Each arm of the cross shape extending from the overlapped part to the end of the arm has a length $L_2$.

The region 132wx includes a plurality of zigzag patterns each of which is formed by the conductive thread 136 and has a longer size in the X direction and a width $W_1$ in the Y direction. In the region 132wx, neighboring zigzag patterns are arranged to shift with respect to each other by a predetermined pitch (e.g., a pitch of $W_1/4$ to $W_1/2$). The region 132wy includes a plurality of zigzag patterns each of which is formed by the conductive thread 136 and has a longer size in the Y direction and the width $W_1$ in the X direction. In the region 132wy, neighboring zigzag patterns are arranged to shift with respect to each other by a predetermined pitch (e.g., a pitch of $W_1/4$ to $W_1/2$). In each of the regions 132wx and 132wy, each zigzag pattern has an apex angle of $\theta_3$ (e.g., 20°).

FIG. 10C illustrates a zigzag pattern formed in the region 132wx. As shown in FIG. 10C, each zigzag pattern in the region 132wx has an apex angle part forming a relatively large acute angle $\theta_4$ ($=90°-\theta_3/2$) with respect to the X direction, and a relatively small acute angle ($=\theta_3/2$) with respect to the Y direction. With this structure, the region 132wx has relatively high extensibility in the X direction and relatively low extensibility in the Y direction.

FIG. 10B illustrates a zigzag pattern formed in the region 132wy. As shown in FIG. 10B, each zigzag pattern in the region 132wy has an apex angle part forming a relatively large acute angle $\theta_4$ ($=90°-\theta_3/2$) with respect to the Y direction, and a relatively small acute angle ($=\theta_3/2$) ) with respect to the X direction. With this structure, the region 132wy has relatively high extensibility in the Y direction and relatively low extensibility in the X direction. Because the overlapped part of the regions 132wy and 132wx has the apex angle parts having relatively small acute angles both in the X and Y directions, the overlapped part does not extend by a large amount both in the X and Y directions.

If the signal layer 130E is expanded in the Y or X direction, the low resistance region 132w expands by a large amount at the arms having the length $L_2$, and does not extend by a large amount at the overlapped part having the width $L_3$. Since the length $L_2$ is considerably longer than the width $L_3$, the low resistance region 132 exhibits, as a whole, a property of being able to expand both in the X and Y directions.

As described above, the signal layer 130E according to the fifth embodiment has high extensibility both in the X and Y directions. Similarly to the signal layer according to the fourth embodiment, the neighboring zigzag patterns of the conductive thread contact with each other at the plurality of contacting points. Therefore, even if the signal layer 130E is expanded, impedance of the low resistance region 132W is not increased and is kept at a low level.

Since the low resistance region 132W is formed to be the cross shape, it is possible to decrease the size of the low resistance region in comparison with the cases of the above mentioned other embodiments. Such a configuration makes it possible to reduce capacitance between the signal layer and the power layer 140 (or the ground layer 120) and to reduce impedance of the low resistance region. As a result, transmission bandwidth of the signal transmission substrate can be increased.

Sixth Embodiment

Figure 11A:
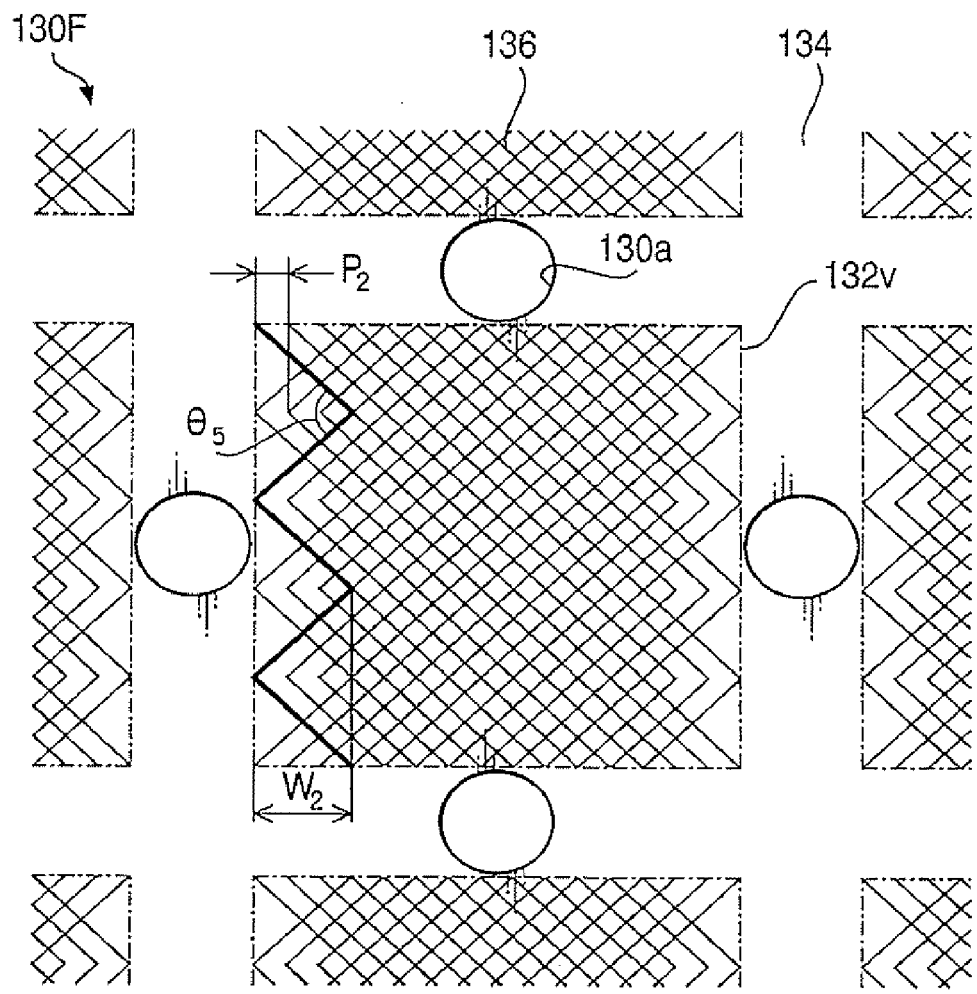
FIG. 11A is a partial top view of a signal layer of a signal transmission substrate according to a sixth embodiment.
Figure 11B:
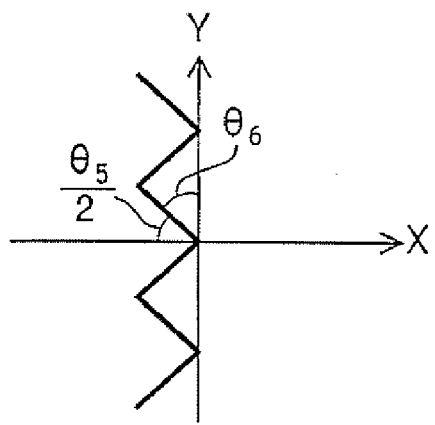
FIG. 11B is an explanatory illustration for explaining extensibility of the signal layer according to the sixth embodiment.

FIG. 11A is a partial top view of a signal layer 130F of a signal transmission substrate according to a sixth embodiment. FIG. 11B is an explanatory illustration for explaining extensibility of the signal layer 130F according to the sixth embodiment. For the purpose of explaining the extensibility of the signal layer, a part of the conductive thread 136 is indicated by a heavy line and the other part of the conductive thread 136 is indicated by a thin line although the entire part of the conductive thread has the same diameter.

In order to form a low resistance region 132v, the conductive thread 136 is sewed in the fabric forming the high resistance region 134 to form a plurality of zigzag patterns of the conductive thread 136. Each zigzag pattern has the length equal to a side of the rectangular shape of the low resistance region 132v in the Y direction, a width $W_2$ in the X direction, and a relatively large apex angle $\theta_5$ (90° in this embodiment). The neighboring zigzag patterns in the low resistance region 132v are shifted with respect to each other by a pitch $P_2$ ($\cong W_2/4$ through $W_2/2$) in the X direction.

As shown in FIG. 11B, an apex angle part of each zigzag pattern in the low resistance region 132v forms an angle $\theta_5/2$ (=45°) with respect to the X direction and an angle $\theta_6$ (=45°) with respect to the Y direction. Such a configuration enables each zigzag pattern to have relatively large maximum changing amounts of these angles ($\theta_5/2$, $\theta_6$) caused when the low resistance region 132v is expanded. That is, the low resistance region 132v is able to expand by a relatively larger both in the X and Y directions. For example, the low resistance region 132v is able to expand to be 1.3 times larger than a normal size.

As described above, the signal layer 130F according to the sixth embodiment has high extensibility both in the X and Y directions. Similarly to the signal layer according to the fourth embodiment, the neighboring zigzag patterns of the conductive thread contact with each other at the plurality of contacting points. Therefore, even if the signal layer is expanded, impedance of the low resistance region 132v is not increased and is kept at a low level.

Seventh Embodiment

Figure 12:
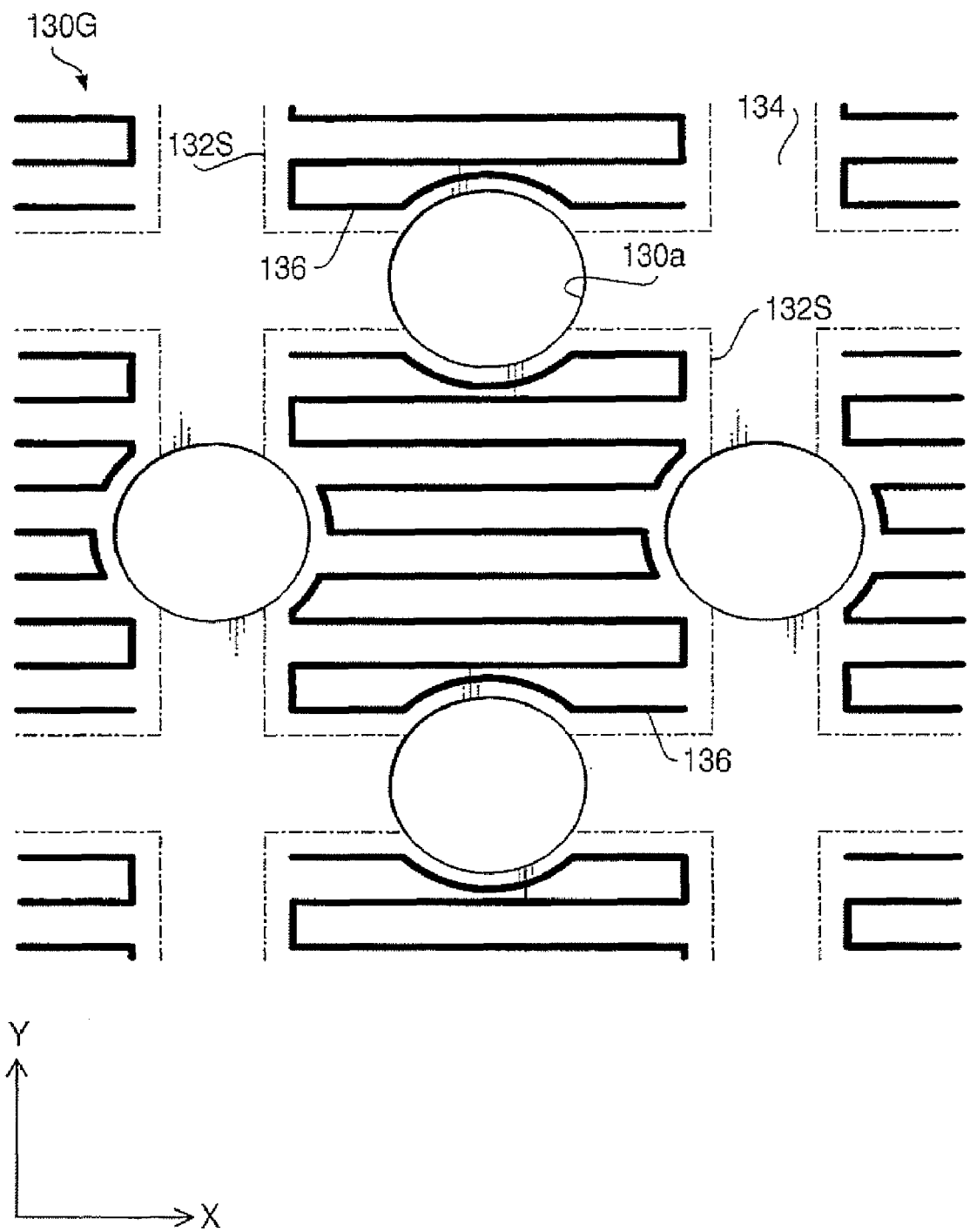
FIG. 12 is a partial top view of a signal layer in a signal transmission substrate according to a seventh embodiment.

FIG. 12 is a partial top view of a signal layer 130G in a signal transmission substrate according to a seventh embodiment. Similarly to the first embodiment, in a low resistance region 132s, the conductive thread 136 is sewed in the fabric forming the high resistance region 134 so that a plurality of lines of the conductive thread are arranged to extend in the X direction and the plurality of lines of the conductive thread closely contact with each other although in FIG. 12 intervals of the lines of the conductive thread are exaggerated for the sake of simplicity. However, in this embodiment, the through hole 130a has a diameter larger than that of the through hole 130a according to the first embodiment.

For this reason, the conductive thread 136 is sewed in the low resistance region 132s to avoid the through holes 130a. As a result, the low resistance region 132s has a recessed part at each side of the rectangular shape. As shown in FIG. 12, space between the neighboring low resistance regions 132s is smaller than the diameter of the through hole 130a.

It is understood that the above mentioned configuration of the seventh embodiment can also be achieved by reducing an area of each low resistance region 132s relative to an area of the low resistance region 132 of the first embodiment, and increasing density of the through holes 130a, without increasing the diameter of the through hole 130a.

Although the present invention has been described in considerable detail with reference to certain preferred embodiments thereof, other embodiments are possible.

For example, the number of low resistance regions and an area of each low resistance region may be changed according to application.

In the above mentioned embodiments, each of the insulating layers, the ground layer 120, the foundation of the signal layer 130, and the power layer is formed of fabric. However, these layers may be formed of material having extensibility, an insulating property and the capability of being subjected to a sewing process. For example, insulating rubber, sponge, or a film having extensibility (e.g., a polyurethane film) may be used as material of these layers.

In the above mentioned embodiments, the low resistance region has a rectangular shape or a cross shape. However, the low resistance region may be formed to have various types of shapes.

This application claims priority of Japanese Patent Application No. P2005-341760, filed on Nov. 28, 2005. The entire subject matter of the applications is incorporated herein by reference.

What is claimed is:

1. A method of manufacturing a conductive layer to be included in a signal transmission substrate for transmitting a signal in accordance with a two-dimensional diffusive signal-transmission technology, the conductive layer having a plurality of low resistance regions and a high resistance region to insulate neighboring ones of the plurality of low resistance regions from each other, the method comprising:
    sewing conductive thread in sheet-like material having an insulating property so as to form one of the plurality of low resistance regions using the conductive thread in the high resistance region formed by the sheet-like material;
    moving the conductive thread from an end point of sewing of a previously sewed low resistance region to a start point of sewing of a low resistance region to be sewed subsequently;
    repeating the sewing and moving to form the plurality of low resistance regions in the high resistance region; and
    forming a plurality of holes in the conductive layer by press working so that an electrical component attached to at least one of the plurality of holes is able to transmit a signal between neighboring ones of the plurality of low resistance regions.

2. The method according to claim 1, wherein the conductive thread interconnecting the start point and the end point of neighboring low resistance regions is also cut by forming the plurality of holes by the press working.

3. The method according to claim 1, wherein the sheet-like material includes fabric.

4. The method according to claim 1, wherein the electrical component includes a communication chip.

5. A signal transmission substrate for transmitting a signal in accordance with a two-dimensional diffusive signal-transmission technology, comprising:

at least one insulating layer;
a conductive layer through which the signal is transmitted; and
at least one through hole part formed in the signal transmission substrate,
wherein the at least one through hole part includes:
  a plurality of through holes respectively formed in a plurality of layers including the at least one insulating layer and the conductive layer forming the signal transmission substrate; and
  a step-like structure formed by a difference between diameters of at least two of the plurality of through holes,
wherein the conductive layer includes:
  a plurality of low resistance regions; and
  a high resistance region serving to insulate the plurality of low resistance regions from each other,
wherein each of the plurality of low resistance regions is formed by conductive thread.

6. The signal transmission substrate according to claim 5, wherein:
  the conductive layer further includes a plurality of holes arranged in a matrix located such that each of the plurality of holes contacts at least two neighboring ones of the plurality of low resistance regions; and
  the plurality of holes serve to respectively catch electrical components.

7. The signal transmission substrate according to claim 6, wherein at least parts of the electrical components are communication chips transmitting a signal in accordance with the two-dimensional diffusive signal-transmission technology.

8. The signal transmission substrate according to claim 7, wherein the other parts of the electrical components are short-circuit members.

9. The signal transmission substrate according to claim 5, wherein the plurality of through holes are aligned concentrically about a center axis of the through hole part.

10. The signal transmission substrate according to claim 5, wherein diameters of at least parts of the plurality of through holes gradually increase toward a top side of the signal transmission substrate.

11. The signal transmission substrate according to claim 10, wherein a bottom one of the plurality of through holes has a diameter larger than a diameter of an adjacent through hole of the plurality of through holes.

12. The signal transmission substrate according to claim 5, wherein the plurality of layers include seven layers of an insulating layer, a ground layer, an insulating layer, the conductive layer, an insulating layer, a power layer, and an insulating layer laminated in this order from a bottom side of the signal transmission substrate.

\* \* \* \* \*